(12) United States Patent
Oshima

(10) Patent No.: US 7,075,111 B2
(45) Date of Patent: Jul. 11, 2006

(54) NITRIDE SEMICONDUCTOR SUBSTRATE AND ITS PRODUCTION METHOD

(75) Inventor: Yuichi Oshima, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 64 days.

(21) Appl. No.: 10/779,740

(22) Filed: Feb. 18, 2004

(65) Prior Publication Data
US 2005/0104082 A1 May 19, 2005

(30) Foreign Application Priority Data
Nov. 14, 2003 (JP) .............................. 2003-385397

(51) Int. Cl.
  H01L 29/15 (2006.01)
  H01L 31/0256 (2006.01)
  H01L 29/12 (2006.01)
(52) U.S. Cl. .................. 257/76; 257/613; 257/E29.1
(58) Field of Classification Search .................. 257/76, 257/613
See application file for complete search history.

(56) References Cited

U.S. PATENT DOCUMENTS

| | | | |
|---|---|---|---|
| 5,290,393 A | 3/1994 | Nakamura | |
| 2002/0197825 A1 | 12/2002 | Usui et al. | |
| 2005/0087753 A1* | 4/2005 | D'Evelyn et al. | 257/98 |
| 2005/0095768 A1* | 5/2005 | Tsuda et al. | 438/200 |
| 2005/0145879 A1* | 7/2005 | Nakayama et al. | 257/103 |

FOREIGN PATENT DOCUMENTS

| | | |
|---|---|---|
| JP | 4-297023 | 10/1992 |
| JP | 2003-178984 | 6/2003 |

* cited by examiner

Primary Examiner—Ngân V. Ngô
(74) Attorney, Agent, or Firm—Sughrue Mion, PLLC

(57) ABSTRACT

A nitride semiconductor substrate having a diameter of 10 mm or more, which has a single-layer structure composed of a nitride semiconductor layer having a basic composition represented by $Al_xGa_{1-x}N$ ($0 \leq x \leq 1$), or a multi-layer structure comprising the nitride semiconductor layer, the mass density of the nitride semiconductor layer being 98% or more of a theoretical mass density $\rho(x)$ represented by the following general formula (1):

$$\rho(x) = \frac{4(M_x + M_N)}{\sqrt{3}\, a_x^2 c_x N_a}, \quad (1)$$

wherein $a_x = a_{GaN} + (a_{AlN} - a_{GaN})x$, wherein $a_{GaN}$ represents an a-axis length of GaN, and $a_{AlN}$ represents an a-axis length of AlN; $c_x = c_{GaN} + (c_{AlN} - c_{GaN})x$, wherein $c_{GaN}$ represents a c-axis length of GaN, and $C_{AlN}$ represents a c-axis length of AlN; $M_x = M_{Ga} + (M_{Al} - M_{Ga})x$, wherein $M_{Ga}$ represents the atomic weight of Ga, and $M_{Al}$ represents the atomic weight of Al; $M_N$ represents the atomic weight of nitrogen; and $N_a$ represents Avogadro's number.

21 Claims, 3 Drawing Sheets

NITRIDE SEMICONDUCTOR SUBSTRATE AND ITS PRODUCTION METHOD

FIELD OF THE INVENTION

The present invention relates to a nitride-type compound semiconductor substrate having a high mass density and a low defect density, and its production method.

BACKGROUND OF THE INVENTION

GaN compound semiconductors such as gallium nitride (GaN), indium gallium nitride (InGaN), aluminum gallium nitride (AlGaN), etc. are attracting much attention as materials for blue-ray light-emitting diodes (LEDs) and laser diodes (LDs). Particularly because GaN compound semiconductors have good heat resistance and environmental resistance, development has been conducted to apply them to electronic devices to utilize their characteristics.

GaN-growing substrates widely used at present are sapphire base substrate. The production of GaN may be carried out generally by epitaxially growing GaN on a single-crystal sapphire base substrate by a metal-organic vapor phase epitaxy (MOVPE) method, etc.

However, because the sapphire base substrate has a different lattice constant from that of GaN, the direct growth of GaN on the sapphire base substrate fails to provide a single-crystal GaN layer. Thus, JP A 4-297023 discloses a method of growing a buffer layer of AlN or GaN on a sapphire base substrate at a low temperature, such that this low-temperature-grown buffer layer relaxes lattice strain, and growing GaN thereon. The use of a low-temperature-grown nitride layer as a buffer layer enables the epitaxial growth of single-crystal GaN. However, even this method cannot remove the discrepancy of a lattice between a substrate and a crystal, resulting in GaN having numerous defects, which are expected to cause problems in the production of GaN laser diodes (LDs).

For the above reasons, the development of self-supported GaN substrates is desired. Because it is difficult to grow a large GaN ingot from a melt like Si and GaAs, various attempts are conducted to grow GaN, by an ultra-high temperature, high-pressure method (S. Porowski and I. Grzegoty, "J. Crystal Growth," Vol. 178, p. 174, 1997), a flux method (H. Yamanera, etc., "Chem. Mater.," Vol. 9, p. 413, 1997), a hydride vapor-phase epitaxy (HVPE) method (H. P. Maruska and J. J. Tietjen, "Appl. Phys. Lett.," Vol. 15, p. 327, 1969), etc.

However, the above methods fail to provide high-quality, large GaN single crystals usable for practical applications. For instance, because the ultra-high-temperature, high-pressure method needs pressures at several tens of thousands of atmospheres and temperatures at several thousands of degrees centigrade as growth conditions, it is difficult to produce large crystals. Accordingly, only crystals of about several millimeters in diameter and about several tens of microns in thickness can be obtained at present.

Though the flux method can conduct crystal growth under the conditions of several hundreds of atmospheres and about 1000° C., it can produce only as small crystals as several millimeters in diameter and several tens of microns in thickness. The flux method suffers from problems such as nitrogen dissociation, the inclusion of fluxes of Na, Ca, etc. into crystals. Also, because the control of the generation of nuclei is difficult at an early stage of growth, polycrystals are likely to be included in single crystals produced.

The HVPE method has succeeded in producing crystals of about 2 inches in diameter. However, because of growth conditions causing a vigorous vapor phase reaction, foreign matters such as polycrystals, etc. are easily included in crystals generated, resulting in poor crystallinity. In addition, nitrogen dissociation occurs remarkably depending on the growth conditions, so that inherently transparent crystals are likely to be colored.

Because these defects occurring in the crystals cause problems in the production of devices, they should be removed as much as possible. JP A 2003-178984 discloses a method of forming a GaN layer and a titanium layer on a sapphire base substrate, heat-treating the substrate in an atmosphere containing a hydrogen gas or a hydrogen-containing compound to generate voids in the GaN layer, and forming a further GaN layer. In this method, a defect density is reduced by using a half width of an X-ray diffraction rocking curve as an index of crystallinity. However, because known evaluation means such as a transmission electron microscope (TEM), an X-ray diffraction (XRD), etc. evaluate the crystallinity of crystals extremely locally, it is difficult to evaluate the entire surfaces of large-area crystals obtained by actual crystal growth processes. Therefore, it has so far been difficult to improve the characteristics of crystal substrates.

OBJECT OF THE INVENTION

Accordingly, an object of the present invention is to provide a high-quality nitride semiconductor substrate with a reduced defect density, and its production method.

SUMMARY OF THE INVENTION

As a result of intense research in view of the above objects, the inventors have found that (a) in view of the fact that the level of large-area defects in crystals, such as impurities, nitrogen dissociation, polycrystals, voids, etc. can be found from the mass density of crystals or its distributions, a high-quality nitride semiconductor crystal with few defects can be obtained by increasing its mass density as an index to a desired level or more; that (b) a high mass density can be obtained by growing the nitride semiconductor with the partial pressure of a nitrogen compound gas kept sufficiently high; and that (c) a heat treatment in a nitrogen compound gas atmosphere after the growth of the nitride semiconductor can further increase the mass density of the nitride semiconductor. The present invention has been achieved based on these findings.

Thus, the nitride semiconductor substrate of the present invention has a diameter of 10 mm or more, which has a single-layer structure composed of a nitride semiconductor layer having a basic composition represented by $Al_xGa_{1-x}N$ ($0 \leq x \leq 1$), or a multi-layer structure comprising the nitride semiconductor layer, the mass density of the nitride semiconductor layer being 98% or more of a theoretical mass density $\rho(x)$ represented by the following general formula (1):

$$\rho(x) = \frac{4(M_x + M_N)}{\sqrt{3}\, a_x^2 c_x N_a}, \tag{1}$$

wherein $a_x = a_{GaN} + (a_{AlN} - a_{GaN})x$, wherein $a_{GaN}$ represents an a-axis length of GaN, and $a_{AlN}$ represents an a-axis length of AlN; $c_x = c_{GaN} + (c_{AlN} - c_{GaN})x$, wherein $c_{GaN}$ represents a c-axis length of GaN, and $c_{AlN}$ represents a c-axis length of AlN; $M_x = M_{Ga} + (M_{Al} - M_{Ga})x$, wherein $M_{Ga}$ represents the atomic weight of Ga, and $M_{Al}$ represents the atomic weight of Al; $M_N$ represents the atomic weight of nitrogen; and $N_a$ represents Avogadro's number.

The nitride semiconductor substrate of the present invention is preferably a self-supported substrate composed of the nitride semiconductor layer. In this case, the nitride semiconductor layer is preferably as thick as 200 μm or more. The distribution of the mass density is preferably within ±0.1% in a plane and within ±0.2% in a thickness direction.

The nitride semiconductor layer is preferably composed of a single crystal. The nitride semiconductor layer preferably has a threading edge dislocation density of $1 \times 10^7$ cm$^{-2}$ or less.

The above-described nitride semiconductor substrate is preferably produced by growing the nitride semiconductor layer by a hydride vapor-phase epitaxy method. In this case, a nitrogen compound gas used as a starting material for the nitride semiconductor layer preferably has a partial pressure of 50 kPa or more. After the nitride semiconductor layer is epitaxially grown, a heat treatment is preferably conducted in an atmosphere containing a nitrogen compound gas. The heat treatment is preferably conducted at a pressure of 4 MPa or more. Also, the heat treatment temperature is preferably 400–1200° C.

The nitride semiconductor layer is preferably epitaxially grown on a different substrate made of sapphire, etc. The epitaxially grown nitride semiconductor layer is preferably separated from the different substrate to provide a self-supported substrate of a nitride semiconductor.

DETAILED DESCRIPTION OF THE PREFERRED EMBODIMENTS

[1] Nitride Semiconductor Substrate

Figure 1:
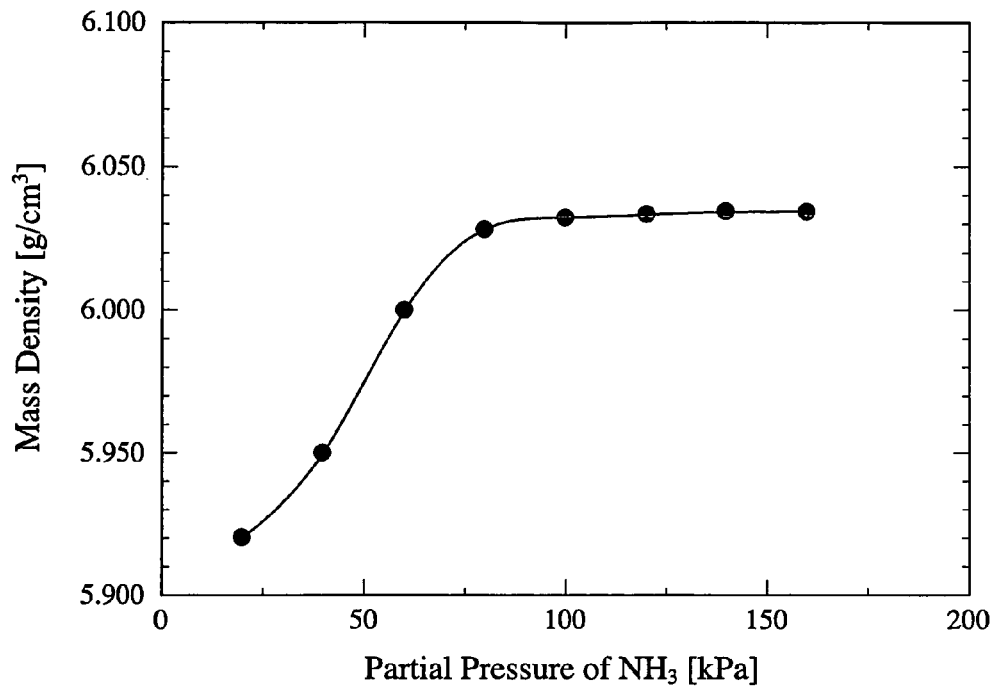
FIG. 1 is a graph showing the relation between a partial pressure of NH$_3$ in the growth of a nitride semiconductor layer and the mass density of the resultant nitride semiconductor layer in Example 1.

The nitride semiconductor substrate of the present invention comprises a III-V nitride semiconductor layer having a basic composition represented by the general formula of $Al_xGa_{1-x}N$ ($0 \leq x \leq 1$), which is GaN when x=0. The AlGaN semiconductor is particularly preferably GaN.

The nitride semiconductor having the above basic composition may contain such elements as indium, etc., if necessary. It may also be doped with Mg, Si, O, etc.

The nitride semiconductor substrate of the present invention has a diameter of 10 mm or more. With a diameter of 10 mm or more, the substrate can have a sufficient area free from influence from an ambient environment during the growth of an epitaxial layer, resulting in the reduction of production cost of LD, etc.

The nitride semiconductor layer of the present invention has a mass density, which is 98% or more of a theoretical mass density ρ (x) represented by the following general formula (1):

$$\rho(x) = \frac{4(M_x + M_N)}{\sqrt{3}\, a_x^2 c_x N_a}, \qquad (1)$$

wherein $a_x = a_{GaN} + (a_{AlN} - a_{GaN})x$, wherein $a_{GaN}$ represents an a-axis length of GaN, and $a_{AlN}$ represents an a-axis length of AlN; $c_x = c_{GaN} + (c_{AlN} - c_{GaN})x$, wherein $c_{GaN}$ represents a c-axis length of GaN, and $c_{AlN}$ represents a c-axis length of AlN; $M_x = M_{Ga} + (M_{Al} - M_{Ga})x$, wherein $M_{Ga}$ represents the atomic weight of Ga, and $M_{Al}$ represents the atomic weight of Al; $M_N$ represents the atomic weight of nitrogen; and $N_a$ represents Avogadro's number.

The mass density of a nitride crystal decreases when there are cracks, voids, nitrogen vacancy, etc. When the nitride crystal contains spiral dislocation having a large Burgers vector, too, its dislocation centers may become micropipes, resulting in decrease in the mass density of the nitride crystal. Accordingly, the mass density becomes nearer the theoretical mass density ρ (x), the crystal has higher quality. The mass density of the nitride semiconductor layer of the present invention (the mass density of the substrate, when the substrate is composed only of a nitride semiconductor layer) is 98% or more, preferably 99% or more, of the theoretical mass density ρ (x). When the mass density is less than 98% of the theoretical mass density ρ (x), devices produced from such substrate, such as LDs, etc., have low reliability.

The mass density can easily be determined by precisely measuring the weight and volume of the nitride semiconductor layer, and calculating a weight/volume ratio. Accordingly, the mass density of the nitride semiconductor layer can easily be determined even if it is a large crystal. To measure the volume of the nitride semiconductor layer precisely to a level corresponding to 0.1 mg/cm$^3$, for instance, an Archimedes' method and an acoustic volume meter (Obata, Ueki, Nezu, Ohiwa and Ishii, "Precise Measurement of Volume of Weight by Acoustic Volume Meter (1)," The Resume of The 35th Annual Conference of The Society of Instrument and Control Engineers, pp. 613–614, 1996) may be used. Using these volume-measuring methods, for instance, as small as 0.1% of nitrogen dissociation in GaN can be detected as the change of a mass density of about 1 mg/cm$^3$. Also, when a distribution of the mass density of the nitride semiconductor layer is determined, a nitride semiconductor crystal may be divided to desired regions, the mass density of a test piece in each region may be measured by the above methods.

The mass density distribution (unevenness) is preferably within ±0.1% in a plane of a nitride semiconductor layer. The in-plane mass density distribution may be determined, for instance, by dividing a surface portion of a nitride semiconductor layer (for instance, a portion to a depth of 200 μm) to a plurality of pieces, and measuring the mass density of each test piece. When the in-plane mass density distribution of the nitride semiconductor layer is more than ±0.1%, devices such as LDs, etc. formed on the substrate have too large unevenness in characteristics.

The mass density distribution is preferably within ±0.2% of the nitride semiconductor layer in a thickness direction. The thickness-direction mass density distribution can be determined, for instance, by dividing the nitride semiconductor layer to a plurality of test pieces in a thickness direction, and measuring the mass density of each test piece. When the thickness-direction mass density distribution of the nitride semiconductor layer is more than ±0.2%, it is likely that the nitride semiconductor substrate is warped by heating to grow an epitaxial layer on the substrate, resulting in the unevenness of a temperature distribution in the substrate.

The nitride semiconductor substrate of the present invention is preferably a self-supported substrate obtained by heteroepitaxially growing an $Al_xGa_{1-x}N$ semiconductor crystal on a substrate of sapphire, etc. different from $Al_xGa_{1-x}N$, and removing the different substrate. The self-supported substrate thus obtained has a larger diameter with a sufficient thickness than those obtained by other production methods such as a sublimation method, a flux method, etc. The "self-supported substrate" here is not limited to a substrate capable of keeping its own shape, but includes those having such strength as to posing no inconvenience in handling. To have such strength, the self-supported substrate is preferably as thick as 200 μm or more. Though not particularly restrictive, the upper limit of the thickness of the self-supported substrate is preferably about 1 mm.

The nitride semiconductor substrate of the present invention is not limited to a self-supported substrate, but may be a different substrate of sapphire, etc., on which the above nitride semiconductor layer is formed.

To produce the self-supported nitride semiconductor substrate, it is preferable to use the void-assisted separation (VAS) method described in JP A 2003-178984. The VAS method comprises growing a GaN layer on a substrate having a GaN layer formed on a base substrate of sapphire, etc. via a thin TiN layer having a network structure, and forming voids in boundaries between the thin TiN layer and the GaN layer. With the voids, the GaN substrate can be easily separated, thereby achieving low dislocation in the GaN substrate.

The nitride semiconductor layer of the present invention preferably has high crystallinity. Accordingly, its two-crystal X-ray diffraction rocking curve preferably has a half width of 250 seconds or less. The nitride semiconductor layer may be either a hexagonal crystal or a cubic crystal, though the hexagonal crystal is more preferable. Because a hexagonal III-V nitride ($Al_xGa_{1-x}N$) semiconductor crystal is more stable than the cubic one, it is possible to form a thick epitaxial layer of a high-crystallinity III-V nitride ($Al_xGa_{1-x}N$) semiconductor crystal, thereby increasing the degree of freedom in the production of devices.

The nitride semiconductor layer preferably has a threading edge dislocation density of $1 \times 10^7$ cm$^{-2}$ or less. Because the threading edge dislocation does not easily affect the mass density, there may be many threading edge dislocations even when the mass density is high. The threading edge dislocation density of more than $1 \times 10^7$ cm$^{-2}$ may adversely affect the characteristics of devices.

[2] Production Method of Nitride Semiconductor Substrate

Figure 2:
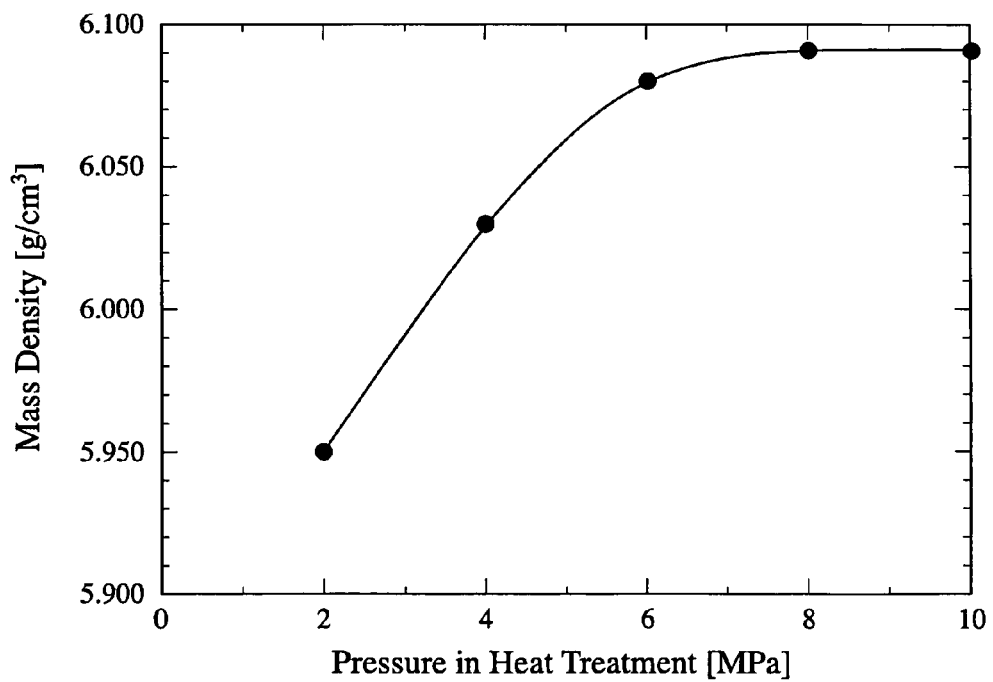
FIG. 2 is a graph showing the relation between a pressure in the heat treatment and the mass density of the nitride semiconductor layer after the heat treatment in Example 2.

The growth of the nitride semiconductor layer is preferably carried out by a hydride vapor-phase epitaxy (HVPE) method. In the growth of the nitride semiconductor layer by the HVPE method, as shown in FIG. 1, the quality of a crystal can be drastically improved by using a nitrogen-containing starting material gas (nitrogen compound gas) such as ammonia, etc. at a partial pressure of 50 kPa or more. When the partial pressure of the nitrogen compound gas is less than 50 kPa, there is remarkable nitrogen dissociation, resulting in decrease in the quality of a crystal. Further, as shown in FIG. 2, by conducting a heat treatment in an atmosphere containing a nitrogen compound gas after the growth of the nitride semiconductor layer, the crystallinity of the substrate can be further improved. This heat treatment is called "ammonia annealing," because it is usually conducted in an ammonia atmosphere. The heat treatment is conducted preferably under pressure, specifically preferably at 4 MPa or more, more preferably at 5 MPa or more. When the pressure of the heat treatment atmosphere is less than 4 MPa, the resultant nitride semiconductor layer does not have an increased mass density, rather resulting in increase in the nitrogen dissociation.

The heat treatment temperature is preferably 400–1200° C. When the heat treatment temperature is lower than 400° C., nitrogen compound molecules have low activity, unable to fill nitrogen vacancy in the nitride semiconductor layer, and thus failing to increase the mass density of the nitride semiconductor layer. On the other hand, when the heat treatment temperature is higher than 1200° C., the dissolution pressure of nitrogen in the nitride semiconductor crystal is too high, resulting in increase in nitrogen vacancy. To accelerate the decomposition of the nitrogen compound gas, plasma or a catalyst may be used in the heat treatment after the growth of the nitride semiconductor layer.

The nitride semiconductor substrate has a low-index surface closest to its surface, which is preferably a C-surface of a hexagonal crystal. Because a III-V nitride semiconductor crystal has strong C-axis orientation, the III-V nitride semiconductor crystal grown on the substrate can be provided with higher crystallinity. Of course, the low-index surface may be a surface other than the C-surface, for instance, an A-surface or an R-surface.

When a III-V nitride is epitaxially grown on a different substrate of sapphire, etc., it grows in an arrangement of a III-group element, a V-group element, a III-group element, a V-group element . . . in a C-axis direction. Accordingly, the C-surface of the III-V nitride semiconductor crystal has strong polarity, and a C-surface substrate composed only of a nitride semiconductor layer has top and bottom surfaces, which are different from each other; one is an III-group element surface, and the other is a V-group element surface. Because the III-group element surface is chemically, mechanically and thermally more stable than the V-group element surface, the III-group element surface can provide a high yield in an epitaxial growth process and in a subsequent device-forming process. Accordingly, the substrate of the present invention composed only of a nitride semiconductor preferably has a top surface, which is a III-group element surface, and a bottom surface, which is a V-group element surface. If the bottom surface is a V-group element surface, the grinding of the bottom surface can easily be conducted when devices are produced with the base substrate finally made thinner as in the production of LED chips and LD chips. Incidentally, when the nitride semiconductor substrate has a structure in which a nitride semiconductor layer is formed on a different substrate, the substrate surface is, of course, preferably a III-group element surface.

The surface of the nitride semiconductor substrate is preferably mirror-polished. Even in an ideal crystal substrate without inclined crystal axes, epitaxial growth on a substrate with surface raggedness provides a crystal having a rough surface reflecting the raggedness of an undersurface, resulting in drastic decrease in a device-forming yield particularly at a photolithography step.

The bottom surface of the nitride semiconductor substrate is also preferably ground flat. The self-supported substrate of a nitride semiconductor (GaN, AlGaN) is obtained by heteroepitaxially growing the nitride semiconductor on a different base substrate and then separating the base substrate. It is thus likely that an as-separated substrate has a rough bottom surface, to which part of the base substrate is attached. In addition, the substrate is sometimes not flat because of its warpage. These phenomena may cause unevenness in a temperature distribution in the substrate in the growth of a heteroepitaxial layer on the substrate, resulting in the deterioration of uniformity in the heteroepitaxial layer, and poor reproducibility.

The method of the present invention may be used to produce not only GaN or AlGaN substrates, but also self-supported, single-crystal substrates of three-element mixed crystals containing other elements, such as indium gallium nitride, etc., and p-GaN substrates doped with Mg, etc.

The present invention will be described in detail referring to Examples below without intention of limiting the present invention thereto.

EXAMPLE 1

A 300-nm-thick GaN layer was formed on a 2-inch-diameter sapphire base substrate by a metal-organic vapor phase epitaxy (MOVPE) method. After Ti was vapor deposited on the GaN layer to a thickness of 20 nm, a heat treatment was conducted at 1000° C. for 30 minutes in a mixed atmosphere of $H_2$ and $NH_3$. The heat-treated substrate was charged into an HVPE furnace, in which GaN was grown to a thickness of 500 µm. Using GaCl and $NH_3$ as starting materials of GaN, the partial pressure of $NH_3$ was caused to change in a range of 20–160 kPa as shown in FIG. 1, with the partial pressure of GaCl fixed at 10 kPa. The resultant GaN layer was spontaneously separated from the sapphire base substrate. The resultant GaN plate was mirror-polished on both surfaces, to provide a 2-inch-diameter, 330-µm-thick, transparent, self-supported GaN substrate.

The mass density of the resultant self-supported GaN substrate measured by an Archimedes' method was, as shown in FIG. 1, 5.920–6.034 $g/cm^3$, about 98–99.5% of a theoretical mass density $\rho$ (x), at the partial pressure of $NH_3$ of 20–160 kPa. The effect of increasing the mass density by elevating the partial pressure of $NH_3$ was saturated substantially at about 100 kPa, at which the mass density was specifically 6.031 $g/cm^3$, about 99.5% of a theoretical mass density $\rho$ (x), nearly 100%. The threading edge dislocation density of this crystal measured by TEM was as low as $4.0 \times 10^6$ $cm^{-2}$.

It is clear that the resultant self-supported GaN substrate had an extremely low nitrogen vacancy density, because of the facts that the GaN crystal had a high mass density and a low threading edge dislocation density, and that the GaN crystal was transparent. It is thus clear that the mass density is effective as an index of crystallinity.

EXAMPLE 2

The self-supported GaN substrate having a mass density of 6.031 $g/cm^3$, which was obtained in Example 1, was sealed in a high-pressure container, and heat-treated at 800° C. for 96 hours in an $NH_3$ atmosphere. During the heat treatment, the pressure was changed in a range of 2–10 MPa, as shown in FIG. 2. The self-supported GaN substrate taken out of a furnace was measured with respect to a mass density by an Archimedes' method. As a result, its mass density was 5.950–6.090 $g/cm^3$, about 98–100% of a theoretical mass density $\rho$ (x). The results are shown in FIG. 2. In this Example, the effect of increasing a mass density by a heat treatment was obtained at a pressure higher than 4 MPa, and saturated substantially at about 8 MPa. Specifically, the mass density at 8 MPa was 6.085 $g/cm^3$, about 99.9% of a theoretical mass density $\rho$ (x), nearly 100%.

Figure 3:
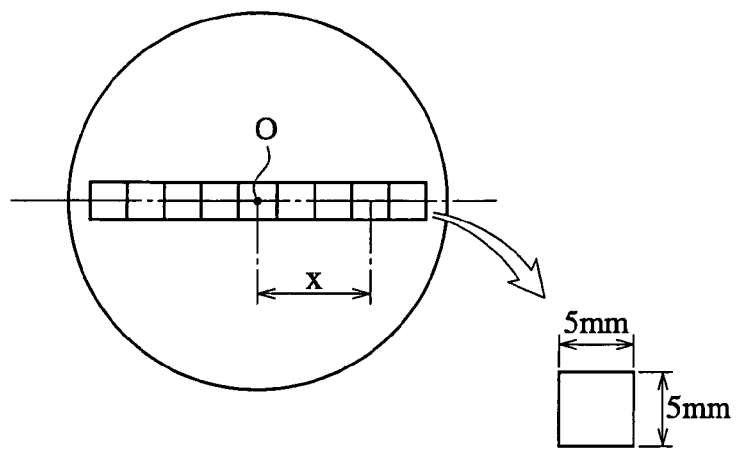
FIG. 3 is a schematic view showing how test pieces are cut out from the substrate to determine an in-plane distribution of the mass density of the nitride semiconductor substrate.
Figure 4:
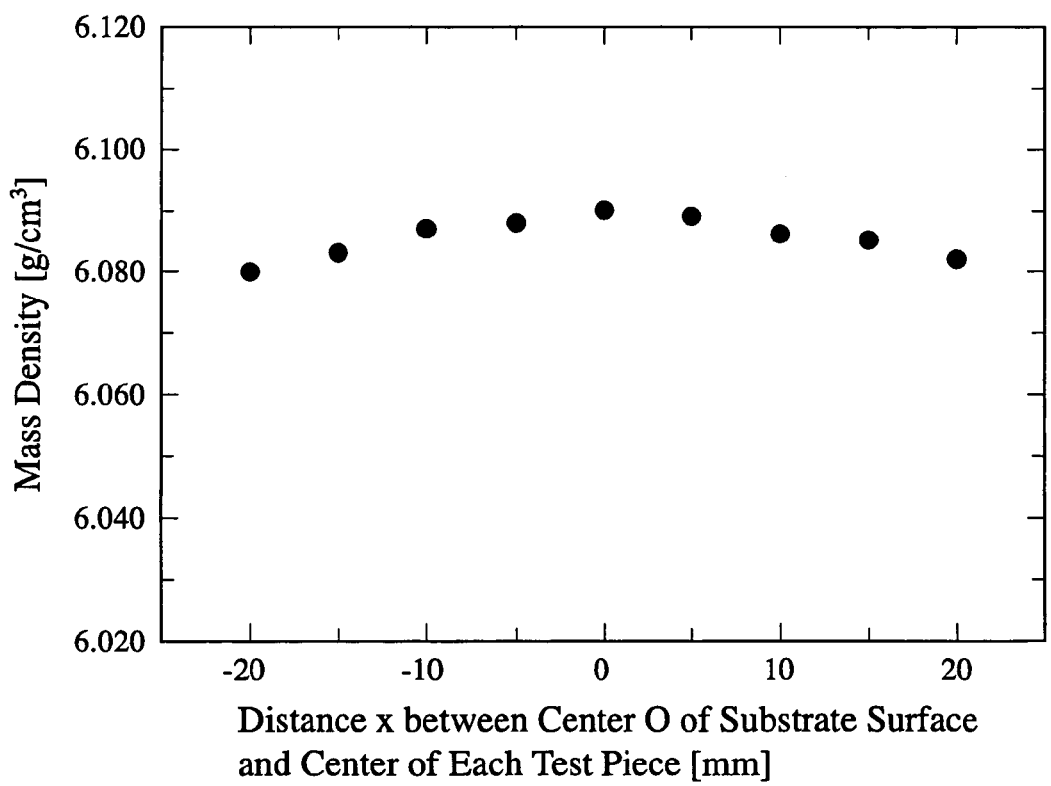
FIG. 4 is a graph showing an in-plane distribution of the mass density of the nitride semiconductor substrate in Example 2.

Test pieces of 5 mm each were cut out from the self-supported GaN substrate heat-treated at 8 MPa along its diameter, as shown in FIG. 3. A central test piece had a center in agreement with a center O of the substrate surface, and other test pieces was arranged along the diameter on both sides of the central test piece. The mass density of each test piece was determined from the volume of each test piece measured by an acoustic volume meter, to obtain an in-plane mass density distribution of the self-supported GaN substrate. The results are shown in FIG. 4, in which a distance x from the center O of the substrate surface means a distance between the center O and a center of each test piece. As is clear from FIG. 4, the in-plane mass density distribution of the self-supported GaN substrate was 6.085±0.005 $g/cm^3$ (±0.082%), with a larger mass density as nearing the center of the substrate.

Figure 5:
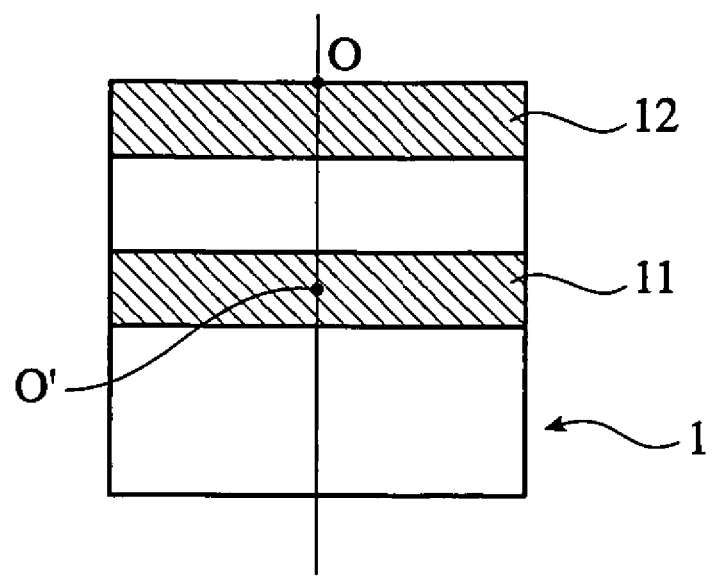
FIG. 5 is a schematic view showing how test pieces for measuring a thickness-direction distribution are cut out from a test piece for measuring the in-plane distribution, to determine the thickness-direction distribution of the mass density of the nitride semiconductor substrate.

Also, as shown in FIG. 5, a 100-µm-thick test piece 11 having a center in agreement with a thickness-direction center O' of the substrate was cut out from the central test piece 1 of 5 mm each, and a test piece 12 having the same thickness was cut out from a surface portion of the central test piece 1. Each test piece 11, 12 was measured with respect to a mass density by the same method as above, resulting in a thickness-direction mass density distribution of 6.085±0.010 $g/cm^3$ (±0.16%).

The above results indicate that the self-supported GaN substrate of the present invention has a highly uniform mass density and thus uniform quality both in a surface direction and in a thickness direction.

COMPARATIVE EXAMPLE 1

A 300-nm-thick GaN layer was formed on a 2-inch-diameter sapphire base substrate by a metal-organic vapor phase epitaxy (MOVPE) method. This was charged into an HVPE furnace to grow GaN to a thickness of 300 µm. GaCl and $NH_3$ were used as starting materials, with the partial pressure of GaCl at 10 kPa, and the partial pressure of $NH_3$ at 30 kPa. The resultant 330-µm-thick GaN layer was separated from the sapphire base substrate by a laser separating method (M. K. Kelly, O. Ambacher, R. Dimitrov, R. Handschuh and M. Stutzmann, Phys. Status Solidi (a), Vol. 159, R3, 1997). A GaN substrate of about 15 mm each at maximum was obtained, though the GaN layer was cracked during separating.

The mass density of the resultant self-supported GaN substrate measured by an Archimedes' method was 5.909 $g/cm^3$, about 97% of a theoretical mass density $\rho$ (x). The threading edge dislocation density of this crystal measured by TEM was as high as $5.5 \times 10^8$ $cm^{-2}$. This crystal was slightly grayish, indicating that it contained nitrogen vacancy at high density.

The nitride semiconductor substrates of the present invention can be uses as substrates for forming devices of GaN or AlGaN. Low-defect density, high-quality crystals of GaN or AlGaN obtained by the present invention are particularly suitable as substrates for high-reliability, high-performance laser diodes.

With 50 kPa or more of a nitrogen compound gas partial pressure in the growth of the nitride semiconductor by an HVPE method according to the present invention, it is possible to obtain a nitride semiconductor substrate with a high mass density and a high crystal quality. In addition, by annealing in a high-pressure nitrogen compound gas after the growth of the nitride semiconductor crystal, crystallinity can be further increased.

What is claimed is:

1. A nitride semiconductor substrate having a diameter of 10 mm or more comprising a nitride semiconductor layer having a basic composition represented by $Al_xGa_{1-x}N$ ($0 \leq x \leq 1$), the mass density of said nitride semiconductor layer being 98% or more of a theoretical mass density $\rho(x)$ represented by the following general formula (1):

$$\rho(x) = \frac{4(M_x + M_N)}{\sqrt{3}\, a_x^2 c_x N_a}, \quad (1)$$

wherein $a_x = a_{GaN} + (a_{AlN} - c_{GaN})x$, wherein $c_{GaN}$ represents an a-axis length of GaN, and $a_{AlN}$ represents an a-axis length of AlN; $c_x = c_{GaN} + (C_{AlN} - c_{GaN})x$, wherein $c_{GaN}$ represents a c-axis length of GaN, and $C_{AlN}$ represents a c-axis length of AlN; $M_x = M_{Ga} + (M_{Al} - M_{Ga})x$, wherein $M_{Ga}$ represents the atomic weight of Ga, and $M_{Al}$ represents the atomic weight of Al; $M_N$ represents the atomic weight of nitrogen; and $N_a$ represents Avogadro's number.

2. The nitride semiconductor substrate according to claim 1, wherein it is a self-supported substrate composed of said nitride semiconductor layer.

3. The nitride semiconductor substrate according to claim 2, wherein said nitride semiconductor layer has a thickness of 200 μm or more.

4. The nitride semiconductor substrate according to claim 1, wherein a distribution of said mass density is within ±0.1% in a plane.

5. The nitride semiconductor substrate according to claim 1, wherein a distribution of said mass density is within ±0.2% in a thickness direction.

6. The nitride semiconductor substrate according to claim 1, wherein said nitride semiconductor layer is composed of a single crystal.

7. The nitride semiconductor substrate according to claim 1, wherein said nitride semiconductor layer has a threading edge dislocation density of $1 \times 10^7$ cm$^2$ or less.

8. A method for producing the nitride semiconductor substrate according to claim 1, wherein said nitride semiconductor layer is grown by a hydride vapor-phase epitaxy method.

9. The method for producing a nitride semiconductor substrate according to claim 8, wherein a nitrogen compound gas used as a starting material for said nitride semiconductor layer has a partial pressure of 50 kPa or more.

10. The method for producing a nitride semiconductor substrate according to claim 8, wherein said nitride semiconductor layer is epitaxially grown on a different substrate.

11. The method for producing a nitride semiconductor substrate according to claim 10, wherein the epitaxially grown nitride semiconductor layer is separated from the different substrate to provide a self-supported substrate of a nitride semiconductor.

12. The method for producing a nitride semiconductor substrate according to claim 8, wherein after said nitride semiconductor layer is epitaxially grown, a heat treatment is conducted in an atmosphere containing a nitrogen compound gas.

13. The method for producing a nitride semiconductor substrate according to claim 12, wherein said heat treatment is conducted at a pressure of 4 MPa or more.

14. The method for producing a nitride semiconductor substrate according to claim 12, wherein a heat treatment temperature is 400–1200° C.

15. The nitride semiconductor substrate according to claim 1, said nitride semiconductor layer being grown by a hydride vapor-phase epitaxy method.

16. The nitride semiconductor substrate according to claim 15, wherein a nitrogen compound gas used as a starting material for said nitride has a partial pressure of 50 kPa or more.

17. The nitride semiconductor substrate according to claim 15, wherein said nitride semiconductor layer is epitaxially grown on a different substrate.

18. The nitride semiconductor substrate according to claim 17, wherein the epitaxially grown nitride semiconductor layer is separated from the different substrate to provide a self-supported substrate of a nitride semiconductor.

19. The nitride semiconductor substrate according to claim 15, wherein after said nitride semiconductor layer is epitaxially grown, a heat treatment is conducted in an atmosphere containing a nitrogen compound gas.

20. The nitride semiconductor substrate according to claim 19, wherein said heat treatment is conducted at a pressure of 4 MPa or more.

21. The nitride semiconductor substrate according to claim 19, wherein a heat treatment temperature is 400–1200° C.

* * * * *